United States Patent [19]

Fortuna

[11] 4,255,851
[45] Mar. 17, 1981

[54] METHOD AND APPARATUS FOR INDELIBLY MARKING ARTICLES DURING A MANUFACTURING PROCESS

[75] Inventor: Joseph J. Fortuna, Lehigh County, Pa.

[73] Assignee: Western Electric Company, Inc., New York, N.Y.

[21] Appl. No.: 967,175

[22] Filed: Dec. 6, 1978

[51] Int. Cl.³ .............................................. H05K 3/30
[52] U.S. Cl. ....................................... 29/827; 29/593; 29/740
[58] Field of Search ................. 29/593, 626, 740, 827; 228/103; 219/68, 69 G, 383, 384

[56] References Cited

U.S. PATENT DOCUMENTS

| | | | |
|---|---|---|---|
| 2,316,388 | 4/1943 | Annis | 219/68 |
| 2,646,609 | 7/1953 | Heins | 219/68 |
| 3,265,860 | 8/1966 | Klossika | 219/68 |
| 3,949,925 | 4/1976 | Keizer et al. | 29/626 |
| 3,969,601 | 7/1976 | Rocklin | 219/69 G |
| 4,024,522 | 5/1977 | Clark et al. | 228/103 |

*Primary Examiner*—Lowell A. Larson
*Attorney, Agent, or Firm*—G. W. Houseweart

[57] ABSTRACT

An indelible mark (26) is produced on an article of manufacture (17) for indicating a defective article. In the preferred embodiment a bonded lead frame assembly (17) which has a lead frame site (14, 15) with a semiconductor die (18) and cracked ceramic substrate (20) bonded thereto is indelibly marked by causing a spark to occur from an electrode (25) to the bonded lead frame assembly (17) in the vicinity of the lead frame site (14, 15) having a cracked substrate (20).

6 Claims, 4 Drawing Figures

METHOD AND APPARATUS FOR INDELIBLY MARKING ARTICLES DURING A MANUFACTURING PROCESS

TECHNICAL FIELD

This invention relates to a method and apparatus for indelibly marking articles during a manufacturing process; and more particularly, for indicating on lead frames, which have semiconductor die bonded thereto, the presence of a defective ceramic substrate. Viewed from another aspect, this invention is directed toward visually indicating selected ones of plurality of apparently similar, connected devices to enable later identification at the time of separation.

BACKGROUND OF THE INVENTION

The manufacturing process of semiconductor devices is interlaced with testing and inspection operations. While many of these testing and inspection operations involve direct human interaction with the manufactured device, a large percentage of these testing operations are automated. That is, a machine will sequentially test each of a series of devices to determine whether each individual device is satisfactory or unsatisfactory, and identify the satisfactory devices from the unsatisfactory (reject) ones. Reject devices which are physically separate from other devices can be physically placed in a reject pile. However, where the devices are connected together as, for example, semiconductor dice on a wafer, or bonded semiconductor die on a lead frame assembly consisting of a plurality of bonded devices, immediate physical separation is generally not practical and a marking method for later identifying unsatisfactory devices must be utilized.

One method for marking used extensively in the semiconductor industry on wafers is the use of an ink dot to visually mark reject die on a wafer. The inking method is fairly inexpensive and does not disturb adjacent semiconductor dice. However, the ink has a disadvantage of either being easily smeared or requiring a baking in an oven to set the ink. While these drawbacks are minimal in the wafer processing area, they can become significant in the area of marking defective semiconductor die which are bonded to lead frame assemblies.

Obviously baking ovens involve additional cost to procure and operate, and the bonded assemblies are too large and bulky to conveniently fit in a modest size oven. Other methods of marking such as punching a hole in the metallic lead frame and hand marking have been considered. However, punching produces the risk of disturbing adjacent good devices, and hand marking can place the operator's hand into the vicinity of moving machinery thereby creating a work hazard.

Thus, it can be appreciated that a method of marking articles of manufacture which is inexpensive, indelible, safe, and doesn's disturb adjacent good devices is highly desirable.

SUMMARY OF THE INVENTION

Therefore, it is an object of this invention to provide a marking device which is indelible upon application.

It is also an object of this invention to provide a marking method which is safe and relatively inexpensive.

It is still another object of this invention to provide a marking means which does not disturb adjacent devices.

To these and other ends, a method for marking an article of manufacture in accordance with this invention includes passing a portion of the article under a spark electrode and generating a spark of sufficient energy between the spark electrode and the article of manufacture to indelibly mark the surface of an article.

Also in accordance with this invention is an apparatus for marking an article of manufacture which comprises an electrode and a charging circuit coupled to the electrode and to the article for providing an electrical charge having a predetermined energy and a predetermined voltage sufficient to produce a spark between the electrode and the article to indelibly mark the article.

BRIEF DESCRIPTION OF THE DRAWING

The aforementioned and other features, characteristics, advantages, and the invention in general, will be better understood from the following more detailed description taken in conjunction with accompanying drawing in which.

Figure 1:
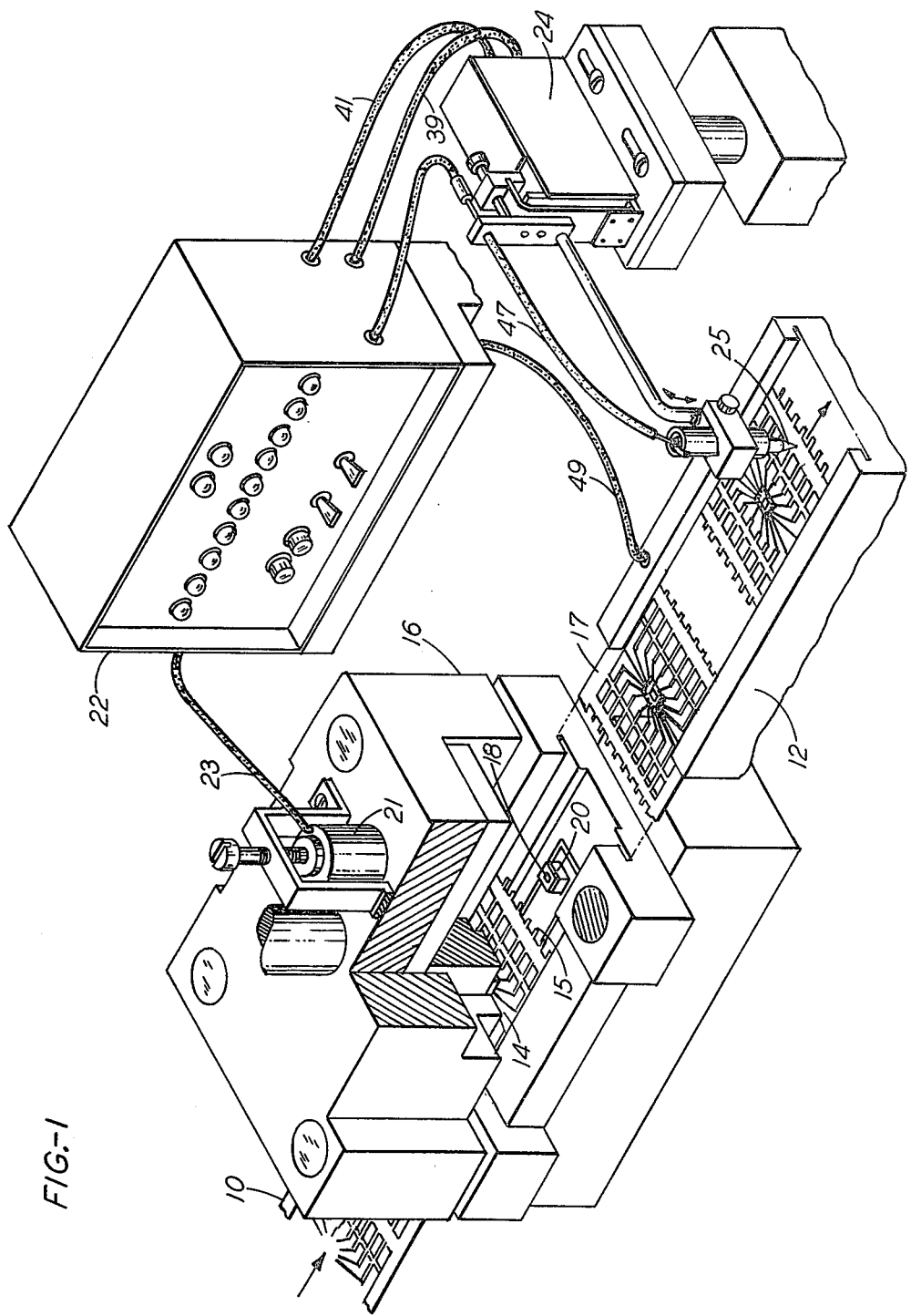
FIG. 1 is a mechanical pictorial view of a semiconductor die bonding, testing, and marking system.

It will be appreciated that for simplicity and clarity of explanation the figures have not necessarily been drawn to scale. Further, where considered appropriate, reference numerals have been repeated in more than one figure to indicate corresponding features.

DETAILED DESCRIPTION

Referring now to FIG. 1, a lead frame tape 10 is drawn through a carrier table 12 wherein several manufacturing operations are performed. The first such operation is a die bond operation wherein two individual lead frame sites 14 and 15 are placed under a die bonding assembly 16. A die bond assembly comprising a semiconductor die 18 which has been previously beam lead bonded to a substrate material 20 is brought under the lead frame site 15 and subsequently bonded to the lead frame by the bonding assembly 16 to become part of a bonded lead frame assembly 17 which is an article of manufacture. Semiconductor die 18 is a beam lead die bonded with the front or diffusion side facing the ceramic substrate 20. Thus, the back side of the semiconductor 18 faces up during the bonding operation and corresponds to the top or front of the bonded lead frame assembly 17. Associated with assembly 16 is an ultrasonic detector 21 which is electrically connected by an electrical cable 23 to an electrical box 22. Electrical box 22 contains circuitry for receiving and discriminating ultrasonic signals from the ultrasonic detector 21 and for generating electrical signals to a marking assembly 24. Marking assembly 24 is shown to be electrically coupled to the electrical box 22 and is positioned in relation to the carrier 12 for marking defective articles of manufacture, which in this embodiment are semiconductor devices on bonded lead frame assembly 17 which have cracked substrates as detected by the ultrasonic detector 21.

The cracking of the ceramic substrate during the bonding operation produces high frequency sounds which are detected and converted into electrical signals by the ultrasonic detector 21. These electrical signals are coupled into an electrical control box 22 via electrical cable 23. Electrical control box 22 receives the signals from the ultrasonic detector 21, amplifies them, and filters out all frequencies outside the frequency range of a particular selected frequency range, e.g., 650 to 750 kilohertz, and peak detects the filtered signal. The output signal from the peak detector is compared to a threshold level, and signals exceeding the threshold level set a latch to indicated that a cracking has occurred during the bond operation. The operation and theory of the ultrasonic detector and associated receiver and detecting unit is well known to those skilled in the art. See for example, U.S. Pat. No. 3,924,456 by S. J. Vahaviolos entitled "Method and Apparatus for Detecting the Presence of Cracks in a Workpiece by the Use of Stress Waves Emitted Therefrom" and assigned to the assignee hereof.

Also contained within the electrical box 22 is control circuitry for the marking assembly 24. The control circuitry is described in more detail with reference to FIG. 4. However, with further reference now to FIG. 1, the control circuitry provides a charge to an electrode 25, and a signal to lower the electrode 25 at the proper time such that the electrode 25 is brought into sufficiently close proximity with the bonded lead frame assembly 17 to permit a spark to occur between the electrode 25 and the bonded lead frame assembly 17 in the vicinity of the defective ceramic. In the preferred embodiment the electrode 25 continues to travel downward until it rests against the bonded lead frame assembly 17 to ensure sufficiently close positioning to permit sparking. The electrode 25 stays in contact with the assembly 17 for approximately 250 to 500 milliseconds before it returns to its idle position.

As will be noted from FIG. 1, the bonding assembly 16 is configured to perform a die bonding operation on two lead frame sites simultaneously. As a result, the ultrasonic detector 21 detects a cracking of either or both substrates during the bonding operation and is unable to determine which of the substrates is defective. Thus, when a marking operation is performed, the spark is directed to the region between the two lead frames indicating to a subsequent inspector that one or both of the ceramic substrates has been cracked during the die bonding operation. Thus alerted, the inspector can easily determine which of the substrates is defective.

It will be understood, however, that the invention is applicable to either a multiple or single bonding head assembly. A substrate cracked during a single bonding operation could be marked on any side of the associated lead frame site, but preferably in a position to conveniently indicate to an inspector that the substrate has been cracked.

Figure 2:
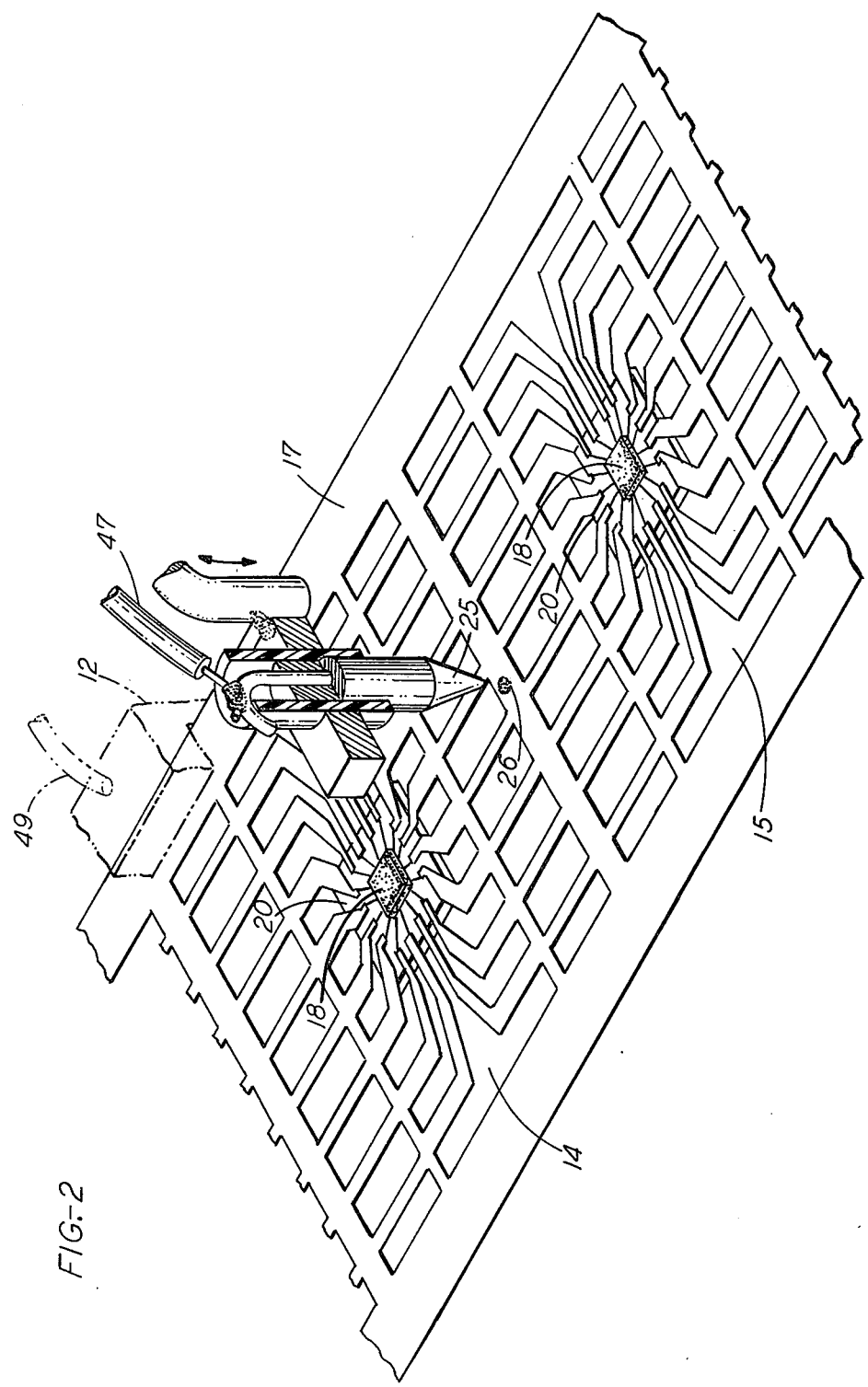
FIG. 2 is a breakaway pictorial view of a portion of the lead frame assembly and apparatus depicted in FIG. 1.

FIG. 2 depicts a breakaway portion of a bonded lead frame assembly 17 containing lead frame sites 14 and 15 which have been bonded to the ceramic substrates 20 which in turn has been bonded to the semiconductors 18. Also shown is an indelible mark 26 produced by the spark electrode 25. Note that the mark 26 is placed approximately in the middle of the bonded lead frame assembly 17 so that an inspector using a microscope and moving the bonded lead frame assembly through her viewing area can easily detect the mark 26.

As a variation of the preferred embodiment described herein, one could provide more than a single mark to enhance ease of inspection or for other reasons such as, for example, to encode failure types during multiple testing on a single lead frame. For example, several tests or inspections could be performed on the components of the lead frame assembly prior to separation of each site from the assembly. The result of each test could be placed in a different position or otherwise encoded on the lead frame and an automatic mark detector could place each device into one of several bins after separation from the assembly.

Cooper which has been plated with about five microinches (1270 Angstroms) of nickel has been found to be an advantageous material for the lead frame tape 10 in the presently preferred embodiment of this invention. With such material the spark produces a darkened area 26 principally by oxidizing the nickel to produce nickel oxide (NiO). Cupric oxide (CuO) is also produced in cases which the spark has enough energy to evaporate the nickel coating in the spark vicinity and extend into the copper. It is also possible to create a visually identifiable area by pitting the surface of a lead frame or other article of manufacture which does not have an oxidizable surface.

Advantageously, mark 26 is placed in the area between frame sites 14 and 15 which is to be later discarded or scrapped during the manufacturing operation when sites 14 and 15 are removed from the bonded lead frame assembly 17. This is advantageous since the mark thereby does not disturb the components in either site 14 or site 15 and thus a mismark due to a malfunction in testing does not destroy a component. Also, with such positioning of the mark 26 the lead frame can more readily absorb the heat produced by the spark without significantly affecting either device 14 or 15. Thus the marking mechanism does not disturb adjacent devices. Also, the spark produced during marking produces minimal disturbance to other machinery. Since the marking mechamism is automated, it is safe for operator personnel.

Figure 3:
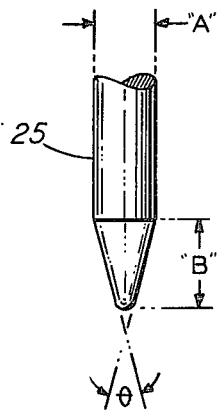
FIG. 3 is a detailed pictorial view of the electrode.

FIG. 3 depicts electrode 25 in detail. In the preferred embodiment the electrode 25 is made of Poco #3 Graphite available from Electrotols, Inc. of Broadview, Illinois. The diameter of the electrode, Dimension A, is one-eighth inch (3.175 mm) and the heighth of the taper region, Dimension B, is five thirty-seconds of an inch (3.969 mm). The taper, Angle, forms an angle of 30° with a spherical tip. It will be understood that these dimensions are not critical and are determined by principals well known in the art.

Figure 4:
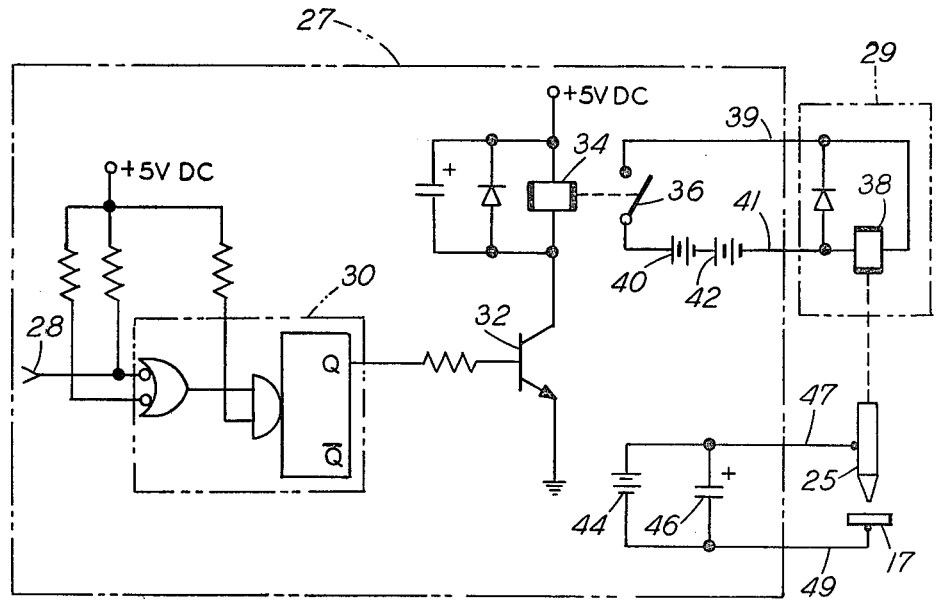
FIG. 4 is an electrical schematic circuit diagram of the marking electrical circuitry.

FIG. 4 shows the schematic diagram of the control circuitry of the marker assembly 24. Broken-line rectangle 27 indicates that portion of the circuitry located inside the electrical box 22; and the circuitry in broken-line rectangle 29 is located in the marker assembly 24. An input terminal 28 receives signals from the last stage of a counter (not shown) which advantageously keeps track of the position of defective bonded lead frames 14 and 15, and activates a timing circuit 30. Timing circuit 30 is a one shot multivibrator of a common type such as the MC74121 (manufactured by Motorola, Inc.) which provides a pulse of approximately 250 to 500 milliseconds long in the preferred embodiment to the base of a transistor 32, which in turn activates a relay coil 34. This closes relay contacts 36 to provide voltage to a solenoid coil 38 via electrical wires 39 and 41. The solenoid pushes the electrode 25 in a arcuate motion down towards the bonded lead frame assembly 17. Power supplies shown schematically as 40 and 42 provide voltage to the solenoid as appropriate for the mechanism.

In the preferred embodiment the solenoid coil 38 actuating mechanism is of a type as included in an Electroglas Model 395 inker assembly. The associated resistors, capacitors and diodes shown in the schematic diagram described serve common functions as will be understood by those skilled in the art.

The remainder of the schematic diagram in FIG. 4 depicts the charging circuitry for the electrode. A power supply 44 provides 30 volts at a maximum current of 100 milliamps in the preferred embodiment. This power supply is used to charge capacitor 46 (which in the preferred embodiment is 4400 microfarads) during the idle or up time of the marker. One electrode of the capacitor and the power supply is connected to the sparking electrode 25 via wire 47 and the other terminal of the capacitor 46 and the negative terminal of the power supply 44 is connected via wire 49 to the strip line assembly carrier 12 which makes intimate contact with the bonded lead frame assembly 17.

In operation a signal indicating that one of the lead frames either to the immediate right or left of the marking assembly 24 has a cracked substrate is provided to input terminal 28 and is stretched out for 250 to 500 microseconds by one shot multivibrator 30 to consequently activate relay coil 34. Relay contact 36 is thereby closed to drive the sparking electrode 25 down to rest against the bonded lead frame assembly 17. The capacitor 46 has been charged to 30 volts, and when the spark electrode 25 comes into close proximity to the lead frame, the air between the electrode and the lead frame is ionized and a spark occurs between the electrode and the lead frame which oxidizes and pits the surface of the bonded lead frame 17 and discharges the capacitor 46. Since the power supply 44 has only a 100 milliamp capability, it quickly goes into a current limiting mode and the voltage is decreased to zero volts at its output when the electrode 25 touches the bonded lead frame assembly 17.

Subsequent to the discharge and return cycle of the electrode 25, the power supply 44 is able to recharge capacitor 46 in preparation for the next marking operation.

Electrode 25 becomes burned during the sparking process and must be periodically replaced. Replacement however is inexpensive and is required in our experience in three-week to two-month intervals depending on the operation of the line. Thus, the total marking system is relatively inexpensive compared to an inking system.

Although the invention has been described in part by making detailed reference to a certain specific embodiment, such detail is intended to be and will be understood to be instructive rather than restrictive. It will be appreciated by those in the art that many variations may be made in the structure and mode of operation without departing from the spirit and scope of the invention as disclosed in the teachings contained herein. For example, the power supply 44 and capacitor 46 could be gated to the spark electrode 25 such that the electrode 25 is placed in a closely spaced relationship with the bonded lead frame assembly 17 before it is electrically connected to the capacitor. Also, it may be considered advantageous to disconnect the power supply 44 after the capacitor 46 is charged and prior to the actual sparking and marking of the lead frame so that no interaction between the power supply and the spark electrode 25 occurs during the marking operation.

What is claimed is:

1. A method of indicating a defective site in a lead frame assembly having a plurality of components bonded thereto comprising the steps of:
   (a) positioning a portion of the lead frame assembly which will be discarded in a later manufacturing process and which is in the region of the defective component into a spaced relationship with a charged spark electrode; and
   (b) producing a spark between said electrode and the lead frame assembly for marking said portion of the lead frame.

2. A method as set forth in claim 1, wherein said spark produces an oxidation in the lead frame.

3. A method as set forth in claim 2, wherein said lead frame material comprises copper with an oxidizable coating thereon.

4. A method as set forth in claim 1, wherein said spark produces an indelible mark.

5. An automated assembly method for bonding ceramic substrates having semiconductor die attached thereto to a lead frame assembly and inspection of the bonded devices comprising the steps of:
   (a) aligning a ceramic substrate with one of a plurality of lead frame sites of a lead frame assembly in a bonding machine;
   (b) bonding the ceramic substrate to said one of a plurality of lead frame sites;
   (c) ultrasonically testing the ceramic substrates for the occurrence of cracks in the ceramic during said bonding process;
   (d) automatically storing said occurrence of said cracks for later marking of defective substrates;
   (e) advancing the lead frame assembly into proximity with a lead frame marking electrode; and
   (f) automatically discharging a spark from said electrode to a portion of the lead frame assembly in the vicinity of a lead frame site having a semiconductor die with a defective substrate attached thereto for indicating that a bonded semiconductor die has a defective substrate, said portion lying in a region of the lead frame assembly which will be discarded in a later manufacturing process.

6. The improvement as recited in claim 5, wherein the lead frame comprises nickel plated copper.

* * * * *